United States Patent [19]
Tuttle

[11] Patent Number: 5,905,296
[45] Date of Patent: *May 18, 1999

[54] RESISTIVE STRUCTURE FOR INTEGRATED CIRCUITS

[75] Inventor: Mark E. Tuttle, Boise, Id.

[73] Assignee: Micron Technology, Inc.

[ * ] Notice: This patent is subject to a terminal disclaimer.

[21] Appl. No.: 08/827,632

[22] Filed: Apr. 9, 1997

Related U.S. Application Data

[62] Division of application No. 08/426,045, Apr. 21, 1995, Pat. No. 5,739,577.

[51] Int. Cl.$^6$ ..................................................... H01L 29/78
[52] U.S. Cl. .......................... 257/536; 257/379; 257/537; 257/538; 257/577; 257/904; 365/154
[58] Field of Search ................................. 257/379, 536, 257/537, 538, 577, 904; 365/154

[56] References Cited

U.S. PATENT DOCUMENTS

| | | | |
|---|---|---|---|
| 5,111,068 | 5/1992 | Kusakabe | 327/303.1 |
| 5,296,726 | 3/1994 | MacElwee | 257/213 |
| 5,382,807 | 1/1995 | Tsutsumi et al. | 257/69 |
| 5,445,608 | 8/1995 | Chen et al. | 604/20 |

OTHER PUBLICATIONS

Berggren, M., et al., "Light–emitting diodes with variable colours from polymer blends," *Nature*, vol. 371, Dec. 1, 1994, pp. 444–446.

Leon, R., et al., "Spatially Resolved Visible Luminescence of Self–Assembled Semiconductor Quantum Dots," *Science*, vol. 267, Mar. 31, 1995, pp. 1966–1968.

Granström, M. et al., "Micrometer–and Nanometer–Sized Polymeric Light–Emitting Diodes," *Science*, vol. 267, Mar. 10, 1995, pp. 1479–1481.

Berggren, M., et al., "Polymer LED with Voltage–controlled Colour," WWW printout, last updated Nov. 16, 1994 by Catarina Carlberg, <<null>ccg@ifm.liu.se>, 1 pg.

Granström, M., et al., Nanometer–Sized Polymeric LEDs, WWW printout, last updated Nov. 16, 1995 by Catarina Carlberg, <<null>ccg@ifm.liu.se>, 1 pg.

"Doping of conjugated polymers," WWW printout, last updated Oct. 9, 1995 by Catarina Carlberg, <<null>ccg@ifm.liu.se>, 1 pg.

"Examples of electroluminescent polymers," WWW printout, last updated Aug. 23, 1995, Richard Gymer (OE), Cavendish Laboratory, rwg11@phy.cam.ac.uk, 1 pg.

Callister, William D., Jr., "Electrical Properties of Polymers," *Materials Science and Engineering: An Introduction*, Electrical Properties, Chapter 19.16, © 1985, 1991, 1994 by John Wiley & Sons, Inc., 3 pp.

"After Years in the Dark, Electric Plastic Finally Shines," *Science*, Polymer Technology, vol. 263, Mar. 25, 1994, pp. 1700–1702.

Yam, P., "Plastics Get Wired," Trends in Materials Science, *Scientific American*, Jul. 1995, 6 pp.

ESPRIT Basic Research project LEDFOS 8013, WWW Printout, last updated May 9, 1995, Richard Gymer (OE), Cavendish Laboratory, Madingly Road, Cambridge CB3 0HE, rwg11@phy.cam.ac.uk, 4pp.

*Primary Examiner*—Valencia Wallace
*Attorney, Agent, or Firm*—Workman, Nydegger & Seeley

[57] ABSTRACT

A resistive structure formed on an integrated circuit substrate is disclosed. The structure includes a plurality of resistive elements serially connected. Each resistive element comprises a forward biased semiconductor junction and a reverse biased semiconductor junction. The resistive value of each resistive element can be varied with a preferred range being from about 500 megohms to about 5 gigaohms. In fabrication, the multiple resistive elements are electrically and physically simultaneously formed and are connected in series to obtain higher resistive values. The disclosed resistive structure allows very high resistances to be obtained using very little planar surface area.

33 Claims, 1 Drawing Sheet

RESISTIVE STRUCTURE FOR INTEGRATED CIRCUITS

This application is a divisional of application Ser. No. 08/426,045, filed Apr. 21, 1995 now U.S. Pat. No. 5,739,577.

BACKGROUND

1. The Field of the Invention

This invention relates to integrated circuit structures. More particularly, the present invention relates to resistive structures and methods for forming same on integrated circuits.

2. The Prior Art

One of the most common elements in electrical circuit design is a resistor. Nearly all circuit designs require the inclusion of one or more resistive elements. In the case of discrete electrical components, the resistor is generally the easiest and least expensive component to manufacture when compared to capacitors, inductors, and active components. In the case of integrated circuit elements, however, resistors are often difficult to manufacture. In particular, resistors having high resistive values are difficult to incorporate as part of an integrated circuit.

In general, the resistance value exhibited by a resistor is determined by the cross sectional area of the resistive material and the length of the resistive material. As the length of the resistive material increases, and the resistivity and the cross sectional area of the resistive material remain constant, the total resistance will increase.

In the case of integrated circuits, the amount of planar surface area available for forming resistive elements is limited. For example, as the size of circuit elements decreases, and the density at which those circuit elements are packed onto each die, the area which can be devoted to resistive elements decreases.

In particular, in the case of Static Random Access Memory (SRAM) integrated circuits it is necessary to include load resistors or resistive elements (generally two) in each memory cell. As integrated circuit technology has progressed, the four or six transistors comprising each SRAM cell have greatly decreased in size.

Nevertheless, even though the transistors in the SRAM cell have decreased in size, the resistive value of the load resistive elements must not decrease, and preferably should increase. It will be appreciated that as the number of cells on each integrated circuit increases, it is desirable to increase the resistance of each load resistive element to keep the total current consumed by the integrated circuit from increasing.

In order to increase the resistance of the structures functioning as load resistive elements, one approach in the art has been to reduce the cross sectional area, i.e., the thickness, of the material, generally polysilicon, forming the resistive structure. As the thickness of the resistive structure is decreased, a resulting increase in the total resistive value of the structure occurs.

Disadvantageously, as the thickness of resistive structure decreases, the occurrence of defects introduced during the manufacturing process and other failures increases dramatically. Thus, as the thickness of the structure decreases to increase its total resistive value to desirable levels, the number of failures increases to unacceptable levels. As the size of other integrated circuit components continues to decrease, the problems encountered with increasing the resistive value possessed by the resistive elements included on integrated circuits will continue to be a problem in the art.

In view of the foregoing, it would be an advance in the art to provide an integrated circuit resistive structure which provides a high resistance value in a small planar area and which does not require additional processing steps. It would also be an advance in the art to provide an integrated circuit resistive structure which can provide increased resistance values while decreasing the planar surface area required by the structure and which can be reliably manufactured and operated.

BRIEF SUMMARY AND OBJECTS OF THE INVENTION

In view of the above described state of the art, the present invention seeks to realize the following objects and advantages.

It is a primary object of the present invention to provide an integrated circuit resistive structure which provides a high resistance value in a small planar area.

It is also an object of the present invention to provide an integrated circuit resistive structure and a method of forming same to provide increased resistance values without requiring additional processing steps.

It is a further object of the present invention to provide an integrated circuit resistive structure which can provide increased resistance values in a decreasing planar surface area.

It is another object of the present invention to provide an integrated circuit resistive structure which can provide a range of high resistive values in a small planar area and which can be reliably manufactured and operated.

These and other objects and advantages of the invention will become more fully apparent from the description and claims which follow, or may be learned by the practice of the invention.

The present invention provides a resistive structure and a method of forming same on an integrated circuit substrate so as to provide a range of high resistive values. The structure of the present invention has particular application as a resistive load structure in a static ram memory cell formed on an integrated circuit.

The structure of the present invention includes a plurality of resistive elements. The resistive value of each resistive element can be varied over a wide range with a preferred range being from about 500 megohms to about 5 gigaohms. Multiple resistive elements can be electrically and physically connected in series to obtain higher resistive values.

Each resistive element comprises a forward biased semiconductor junction and a reverse biased semiconductor junction. In the preferred embodiments, the semiconductor junctions comprise pn diode junctions.

Each resistive element includes three regions formed on an integrated circuit substrate, each region is doped to exhibit a type of semiconductor characteristic which is different than the immediately adjacent region. The described semiconductor characteristic may be the characteristic exhibited by either a p type semiconductor material or an n type semiconductor material. The semiconductor regions are alternatively lightly doped or heavily doped, i.e., each region is preferably doped to a different concentration than the immediately adjacent regions.

BRIEF DESCRIPTION OF THE DRAWINGS

In order that the manner in which the above-recited and other advantages and objects of the invention are obtained can be appreciated, a more particular description of the invention briefly described above will be rendered by reference to a specific embodiment thereof which is illustrated in the appended drawings. Understanding that these drawings depict only a typical embodiment of the invention and are not therefore to be considered limiting of its scope, the invention and the presently understood best mode thereof will be described and explained with additional specificity and detail through the use of the accompanying drawings of which.

DETAILED DESCRIPTION OF THE PREFERRED EMBODIMENTS

Reference will now be made to the drawings wherein like structures will be provided with like reference designations. It is to be understood that the drawings are diagrammatic and schematic representations of the embodiment of the present invention and are not drawn to scale.

As noted above, earlier attempts in the art to increase the resistive values of structures on integrated circuits by diffusing ohmic resistive elements and/or decreasing the cross sectional areas of the elements has been unsatisfactory. The present invention overcomes the limitations of the earlier attempts by using a plurality of semiconductor junctions as will now be explained by reference to the drawings which illustrate the presently preferred embodiment of the present invention.

Figure 1:
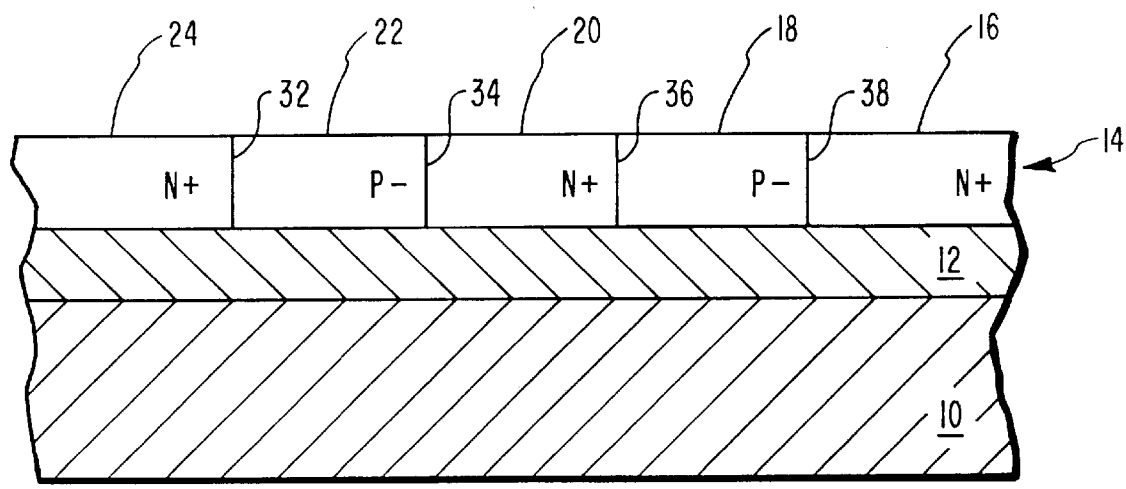
FIG. 1 is a cross sectional view of the presently preferred structure of the present invention.

Referring first to FIG. 1, a semiconductor substrate 10 is represented upon which the structure of the present invention is formed. The resistive structures of the present invention can be formed using conventional integrated fabrication techniques and materials which are known in the art. Accordingly, an insulating layer 12 is first formed on substrate 10 using conventional deposition techniques such as are well-known in the art. By way of example and illustration of insulating layer 12, an oxide layer such as $SiO_2$.

The resistive structures of the present invention are then preferably formed on a second semiconductor layer that is formed over insulating layer 12, which functions to electrically isolate the resistive structures from the substrate. The resistive structures of the present invention can be formed on a single planar semiconductor layer or other multiple layers may contain the resistive structures as will be understood by those skilled in the art after consideration of the teaching of the invention contained herein. Accordingly, in accordance with the method of the present invention, a second semiconductor layer 14 is formed over insulating layer 12 and then a plurality of first regions is simultaneously doped so as to form regions of either P- or N-type semiconductor material having selected concentration as the dopant used. The first regions are spaced one from the other as shown in FIG. 1. Next, a plurality of second regions which are spaced between the first regions are then simultaneously doped with the opposite type of semiconductor material to form alternating regions of a selected concentration of the opposite type semiconductor material. Thus, as illustrated in FIG. 1, there are three regions of heavily doped N+-type semiconductor material which are alternately spaced by the regions of lightly doped P-type semiconductor material. It will of course be appreciated that the concentration and type of material used for doping these regions could be varied.

Represented in FIG. 1 is a diagrammatic cross sectional view of the structure of the present invention arranged in a planar fashion. Illustrated in FIG. 1 are a plurality of regions having the particular semiconductor characteristics and doping concentrations indicated below in Table A.

TABLE A

| Ref. No. | Semiconductor Characteristic | Dopant Concentration |
| --- | --- | --- |
| 16 | n type | + (heavy) |
| 18 | p type | − (light) |
| 20 | n type | + |
| 22 | p type | − |
| 24 | n type | + |

It will be appreciated that the type of semiconductor characteristic and/or the dopant concentration may be altered from that which is designated in Table A and still be within the scope of the present invention. Moreover, it is within the scope of the present invention to provide more than five regions represented in FIG. 1 and Table A. For example, it is within the scope of the present invention to include seven, nine, or more regions to provide higher resistance values.

The alternating regions represented in FIG. 1 form a plurality of pn junctions, each of which act as a diode junction. The solid lines 32, 34, 36, and 38 shown in FIG. 1 represent the mask lines which are used to define each of the regions. Significantly, the resistive structures of the present invention are all simultaneously formed using the same processing steps and are thus formed without including additional mask or processing steps into the overall process to fabricate the completed integrated circuit.

Between each p region and n region a junction is formed. As will be readily understood by those skilled in the art, the dopants used will generally diffuse beyond the edge of the mask to form the junction. It will be appreciated by those skilled in the art that the characteristics of the junction area can be precisely controlled during the fabrication of the integrated circuit, in particular, the resistive characteristics. For example, each region must be of sufficient size and proper dopant concentration such that breakdown of the semiconductor material does not occur at the voltages which will be placed across the structure.

The structure represented in FIG. 1 defines two resistive elements. Each resistive element (comprising junctions 32 and 34 or junctions 36 and 38) includes one junction which will be forward biased and one junction which will be reversed biased. The resistance exhibited by each of the resistive elements can be controlled during the fabrication of the integrated circuit. The preferred range of resistance is from about 500 megohms to about 5 gigaohm for each resistive element. Thus, the illustrated structure will preferably exhibit a total resistance of from about 1 gigaohm to about 10 gigaohms. Once the alternating semiconductor regions are formed so as to define the resistive elements, the resistive elements are then electrically connected in series once again using conventional metalizations or other integrated circuit fabricating processes known in the art.

As greater resistances are needed, the number of series resistive elements can be increased. Importantly, because the resistive structures are formed by parts of diode junctions, the increase in resistance can be achieved without reducing cross-sectional area of resistive material, with the attendant disadvantages of that prior art approach. Moreover, as current consumption must be decreased, additional pairs of junctions can be formed to achieve the desired resistance value without the need to add additional processing steps to the fabrication of the integrated circuit since each diode pair for each resistive structure is simultaneously formed using the same processing steps that are used for the formation of the other resistive structures (e.g., diode pairs). Thus, the present invention includes not only a structure to selectively provide desirably high or very high resistance values but it does so without requiring additional processing steps to the overall fabrication of the integrated circuit.

Figure 2:
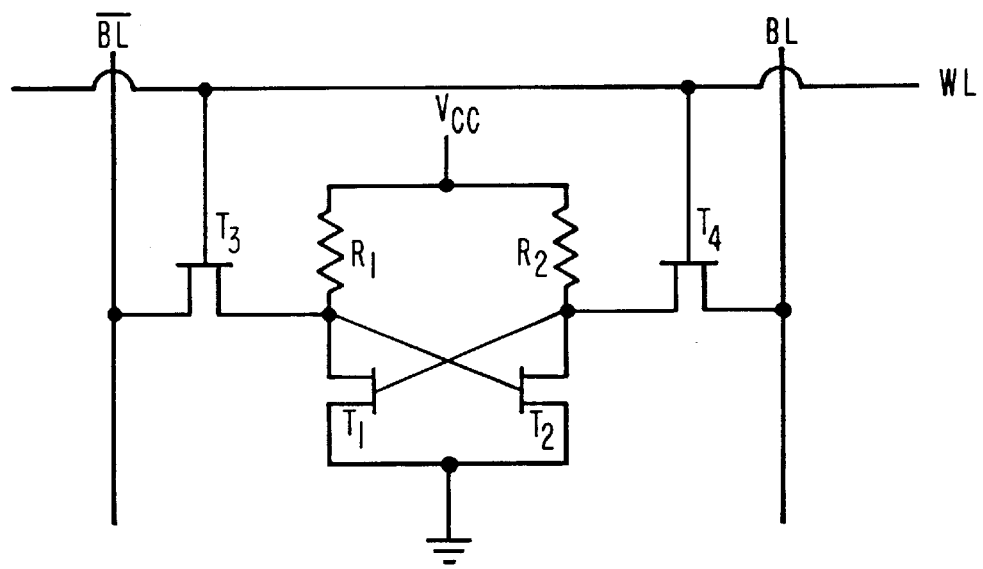
FIG. 2 is a schematic diagram of a static random access memory cell into which the structures of the present invention can be incorporated.

Referring next to FIG. 2, one preferred application of the present invention is represented. FIG. 2 is a schematic representation of a static random access memory (SRAM) cell which includes four transistors ($T_1$, $T_2$, $T_3$, and $T_4$). Also represented are a word line (WL), a bit line (BL), an inverted bit line ($\overline{BL}$), $V_{CC}$ & $V_{SS}$ connections, and a pair of load resistors ($R_1$ and $R_2$). As the packing density of the SRAM integrated circuit increases, the area available for the load resistors decreases causing the earlier discussed problems.

Utilizing the present invention, the illustrated SRAM memory cell can be fabricated so that the proper operation is maintained as the resistive elements are formed in accordance with the present invention to function as load resistors $R_1$ and $R_2$. Thus, by use of the present invention, the current consumption of each SRAM memory cell, and thus the total current consumption of the integrated circuit, can be kept to desirably low levels. It will be appreciated that the present invention also has application in numerous other integrated circuit designs.

After consideration of the foregoing, it will be appreciated that the present invention provides an integrated circuit structure with high resistance values in a small planar area and a method of forming same without requiring processing steps in addition to those already required to fabricate the other structures of the integrated circuit. Furthermore, the present invention provides an integrated circuit resistive structure which can selectively provide a range of high resistance values in a decreasing planar surface area and which can be reliably manufactured and operated.

The present invention may be embodied in other specific forms without departing from its spirit or essential characteristics. The described embodiment is to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. An electrical resistive structure formed on an integrated circuit substrate, the resistive structure comprising:
    a first resistive element comprising a forward biased diode junction and a reverse biased diode junction formed on the substrate;
    a second resistive element comprising a forward biased diode junction and a reverse biased diode junction formed on the substrate; and
    the first resistive element and the second resistive element being serially connected, the resistive structure further comprising an isolation layer formed between the substrate and the diode junctions.

2. An electrical resistive structure formed on an integrated circuit substrate as defined in claim 1 further comprising:
    a third resistive element comprising a forward biased diode junction and a reverse biased diode junction formed on the substrate;
    a fourth resistive element comprising a forward biased diode junction and a reverse biased diode junction formed on the substrate; and
    the first, second, third, and fourth resistive elements being serially connected.

3. An electrical resistive structure formed on an integrated circuit substrate as defined in claim 2 wherein the diode junctions each comprise a pn junction.

4. An electrical resistive structure formed on an integrated circuit substrate comprising:
    a first resistive element comprising a forward biased diode junction and a reverse biased diode junction formed on the substrate;
    a second resistive element comprising a forward biased diode junction and a reverse biased diode junction formed on the substrate; and
    the first resistive element and the second resistive element being serially connected,
    wherein the effective electrical resistance value of the first resistive element is in the range from about 500 megohms to about 5 gigaohms.

5. An electrical resistive structure formed on an integrated circuit substrate as defined in claim 4 wherein the effective electrical resistance value of the first resistive element and second resistive element combined is in the range from about 1 gigaohms to about 10 gigaohms.

6. An electrical resistive structure formed on an integrated circuit substrate, the resistive structure comprising:
    an isolation layer on and in contact with the substrate;
    a first resistive element comprising a forward biased pn diode junction and a reverse biased pn diode junction formed on the isolation layer;
    a second resistive element comprising a forward biased pn diode junction and a reverse biased pn diode junction formed on the isolation layer;
    a third resistive element comprising a forward biased pn diode junction and a reverse biased pn diode junction formed on the isolation layer;
    a fourth resistive element comprising a forward biased pn diode junction and a reverse biased pn diode junction formed on the isolation layer;
    wherein the first, second, third, and fourth resistive elements are connected in series; and
    wherein the first resistive element is adjacent to the second resistive element, the second resistive element is adjacent to the first and third resistive elements, the third resistive element is adjacent to the second and fourth resistive elements, and the fourth resistive element is adjacent to the third and fifth resistive elements.

7. An electrical resistive structure formed on an integrated circuit substrate as defined in claim 6, wherein the effective electrical resistance value of the first resistive element is in the range from about 500 megohms to about 5 gigaohms.

8. An electrical resistive structure formed on an integrated circuit substrate as defined in claim 6, wherein the first, second, third, and fourth resistive elements each comprises:
    a first region which has a first dopant concentration and which exhibits a first type of semiconductor characteristic;
    a second region which has a second dopant concentration and which exhibits a second type of semiconductor characteristic, the second region being adjacent to the first region; and
    a third region which has the first dopant concentration and which exhibits the first type of semiconductor characteristic, the third region being adjacent to the second region.

9. A electrical structure as defined in claim 8, wherein the first type of semiconductor characteristic comprises that exhibited by an n type semiconductor material and the second type of semiconductor characteristic comprises that exhibited by a p type semiconductor material, and wherein the first dopant concentration comprises a heavy dopant concentration and the second dopant concentration comprises a light dopant concentration.

10. A electrical structure as defined in claim 8, wherein the first type of semiconductor characteristic comprises that exhibited by a p type semiconductor material and the second type of semiconductor characteristic comprises that exhibited by an n type semiconductor material.

11. A electrical structure as defined in claim 8, wherein the first type of semiconductor characteristic comprises that exhibited by an n type semiconductor material and the second type of semiconductor characteristic comprises that exhibited by a p type semiconductor material.

12. A electrical structure as defined in claim 8, wherein the first dopant concentration comprises a light dopant concentration and the second dopant concentration comprises a heavy dopant concentration.

13. A electrical structure as defined in claim 8, wherein the first dopant concentration comprises a heavy dopant concentration and the second dopant concentration comprises a light dopant concentration.

14. An electrical resistive structure formed on an integrated circuit substrate, the resistive structure comprising:
   a plurality of resistive elements formed on the substrate, each said resistive element in said plurality of resistive elements comprising a forward biased semiconductor junction and a reverse biased semiconductor junction; and each said resistive element in said plurality of resistive elements being serially connected and adjacent to another of said resistive elements in said plurality of resistive elements.

15. An electrical resistive structure formed on an integrated circuit substrate as defined in claim 14, wherein each said forward biased semiconductor junction and each said reverse biased semiconductor junction is a pn diode junction.

16. An electrical resistive structure formed on an integrated circuit substrate as defined in claim 14, wherein the effective electrical resistance value of each resistive element of said plurality of resistive elements is in the range from about 500 megohms to about 5 gigaohms.

17. An electrical resistive structure formed on an integrated circuit substrate as defined in claim 14, wherein the effective electrical resistance value of said plurality of resistive elements combined is in the range from about 1 gigaohms to about 10 gigaohms.

18. An electrical resistive structure formed on an integrated circuit substrate as defined in claim 14, further comprising an isolation layer formed between the substrate and the diode junctions.

19. An electrical resistive structure comprising:
   an integrated circuit substrate;
   an isolation layer formed on the integrate circuit substrate; and
   a plurality of resistive elements formed on the isolation layer, each said resistive element of said plurality of resistive elements being serially connected and comprising a forward biased semiconductor junction and a reverse biased semiconductor junction.

20. An electrical resistive structure as defined in claim 19, wherein the effective electrical resistance value of each resistive element of said plurality of resistive elements is in the range from about 500 megohms to about 5 gigaohms.

21. An electrical resistive structure as defined in claim 19, wherein the effective electrical resistance value of said plurality of resistive elements combined is in the range from about 1 gigaohms to about 10 gigaohms.

22. An electrical resistive structure as defined in claim 19, wherein each said resistive element of said plurality of resistive elements further comprises:
   a first region which has a first dopant concentration and which exhibits a first type of semiconductor characteristic;
   a second region which has a second dopant concentration and which exhibits a second type of semiconductor characteristic, the second region being adjacent to the first region; and
   a third region which has the first dopant concentration and which exhibits the first type of semiconductor characteristic, the third region being adjacent to the second region.

23. A electrical structure as defined in claim 22, wherein the first type of semiconductor characteristic comprises that exhibited by an n type semiconductor material and the second type of semiconductor characteristic comprises that exhibited by a p type semiconductor material, and wherein the first dopant concentration comprises a heavy dopant concentration and the second dopant concentration comprises a light dopant concentration.

24. A electrical structure as defined in claim 22, wherein the first type of semiconductor characteristic comprises that exhibited by a p type semiconductor material and the second type of semiconductor characteristic comprises that exhibited by an n type semiconductor material.

25. A electrical structure as defined in claim 22, wherein the first type of semiconductor characteristic comprises that exhibited by an n type semiconductor material and the second type of semiconductor characteristic comprises that exhibited by a p type semiconductor material.

26. A electrical structure as defined in claim 22, wherein the first dopant concentration comprises a light dopant concentration and the second dopant concentration comprises a heavy dopant concentration.

27. A electrical structure as defined in claim 22, wherein the first dopant wherein the first dopant concentration comprises a heavy dopant concentration and the second dopant concentration comprises a light dopant concentration.

28. An electrical resistive structure comprising:
   an integrated circuit substrate;
   an isolation layer formed on the integrated circuit substrate; and
   a plurality of resistive elements formed on the isolation layer, each said resistive element of said plurality of resistive elements being serially connected and comprising:
      a forward biased pn diode junction and a reverse biased pn diode junction;
      a first region which has a heavy dopant concentration and is substantially composed of n type semiconductor material;
      a second region which has a light dopant concentration and is substantially composed of p type semiconductor material, the second region being adjacent to the first region; and
      a third region which has a heavy dopant concentration and is substantially composed of n type semiconductor material, the third region being adjacent to the second region.

29. An electrical resistive structure formed on an integrated circuit substrate as defined in claim 4, further comprising:
- a third resistive element comprising a forward biased diode junction and a reverse biased diode junction formed on the substrate;
- a fourth resistive element comprising a forward biased diode junction and a reverse biased diode junction formed on the substrate; and
- the first, second, third, and fourth resistive elements being serially connected.

30. An electrical resistive structure formed on an integrated circuit substrate as defined in claim 29, wherein the diode junctions each comprise a pn junction.

31. A resistive structure comprising:
- a plurality of regions over a substrate, each said region of said plurality of regions:
  - being adjacent to another region of said plurality of regions;
  - being oppositely doped from any region of said plurality of regions that is adjacent thereto; and
  - having one of:
    - a higher dopant concentration when adjacent to a region of said plurality of regions having a lower dopant concentration; and
    - a lower dopant concentration when adjacent to a region of said plurality of regions having a higher dopant concentration; and
- a layer electrically isolating the plurality of regions from the substrate.

32. The resistive structure as defined in claim 31, wherein each region of said plurality of regions having an n type doping is adjacent to another region of said plurality of regions having a p type doping.

33. A resistive structure as defined in claim 31, wherein the resistance value of the plurality of regions combined is in the range from about 500 megohms to about 5 gigaohms.

* * * * *

UNITED STATES PATENT AND TRADEMARK OFFICE
CERTIFICATE OF CORRECTION

PATENT NO. : 5,905,296
DATED : May 18, 1999
INVENTOR(S) : Mark E. Tuttle

It is certified that error appears in the above-identified patent and that said Letters Patent is hereby corrected as shown below:

Col. 1, line 29, after "material" change "remain" to --remains--

Col. 3, lines 39-40, after "example and illustration" change "of insulating layer 12, an oxide" to --insulating layer 12 is an oxide--

Col. 4, line 21, after "than" insert --the--

Col. 7, line 59, after "on the" change "integrate" to --integrated--

Col. 8, lines 43-44, delete the second occurrence of "wherein the first dopant"

Signed and Sealed this

Eighteenth Day of April, 2000

Attest:

Q. TODD DICKINSON

*Attesting Officer*  *Director of Patents and Trademarks*